United States Patent [19]

DeLarge

[11] Patent Number: 4,676,865
[45] Date of Patent: Jun. 30, 1987

[54] PLASMA DESMEAR/ETCHBACK SYSTEM AND METHOD OF USE

[76] Inventor: Richard S. DeLarge, 12631 Amethyst, Garden Grove, Calif. 92645

[21] Appl. No.: 827,087

[22] Filed: Feb. 7, 1986

[51] Int. Cl.$^4$ ............................................. B44C 1/22
[52] U.S. Cl. ................................. 156/643; 156/345; 156/644; 156/656
[58] Field of Search ................ 156/643, 656, 644, 345

[56] References Cited

U.S. PATENT DOCUMENTS 4,012,307 3/1977 Phillips ................................. 156/644
4,430,547 2/1984 Yoneda et al. ...................... 156/643

FOREIGN PATENT DOCUMENTS 2730819 1/1979 Fed. Rep. of Germany ...... 156/643

Primary Examiner—Arthur Kellogg
Attorney, Agent, or Firm—Edgar W. Averill, Jr.

[57] ABSTRACT

A process for etching back the exposed edges of layers of resin in drilled, multi-layered resin/copper laminates. The process includes the steps of heating at least one of the electrode plates in an evacuated chamber and causing a flow of plasma to pass between adjacent plates resulting in the removal of resin from the exposed surface of the copper layers. The invention also includes the apparatus used to carry out this process.

11 Claims, 3 Drawing Figures

U.S. Patent   Jun. 30, 1987   4,676,865
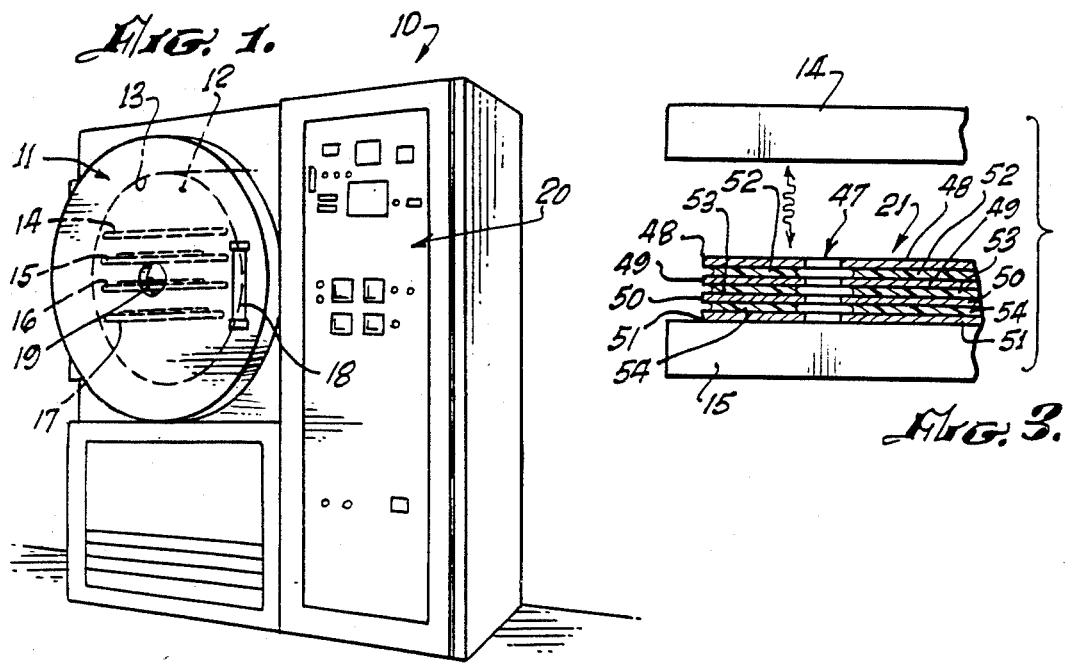
FIG. 1.
FIG. 3.
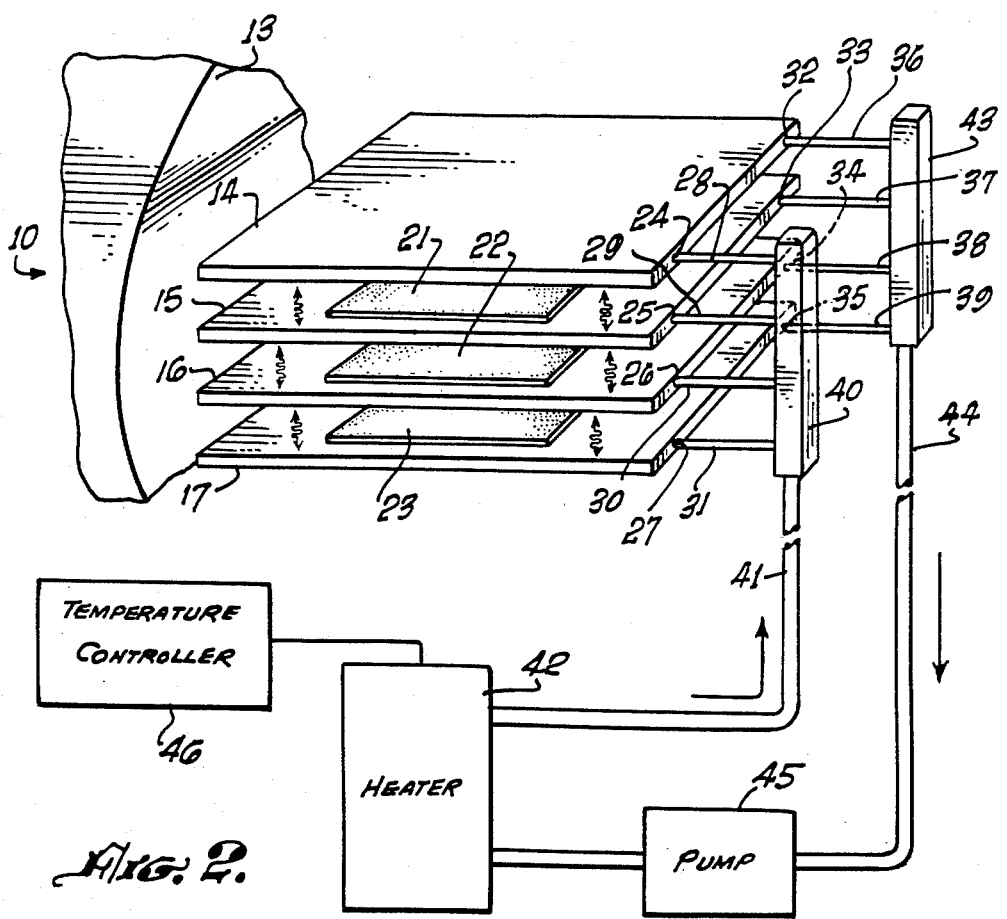
FIG. 2.

PLASMA DESMEAR/ETCHBACK SYSTEM AND METHOD OF USE

BACKGROUND OF INVENTION

The field of the invention is plasma generating processes and apparatus, and the invention relates more particularly to the use of plasma streams to desmear and etchback the openings in multi-layered resin/copper laminates.

The use of plasma to etchback the resin in holes through printed circuit boards is described in U.S. Pat. No. 4,012,307. A process is there-described utilizing an upper electrode positioned on the top of a chamber and a ground electrode positioned on the bottom thereof. A plurality of vertically disposed multi-layer printed circuit boards are placed in the chamber, and the chamber is evacuated and a gas capable of forming an oxidizing plasma is introduced into the reactor. This results in a flow of plasma in the chamber between the radio frequency electrode and the ground electrode which tends to etchback the resin portion of multi-layered boards exposing the copper layers in the openings of the board.

While such system is an improvement over the formerly used chemical dip process, control of the amount of etchback is deficient and processing times are unnecessarily long. The flow of plasma tends to heat the circuit boards which, thus, increase in temperature during processing which, in turn, increases the etch rate. Because the flow of plasma is not exactly uniform throughout the chamber, certain portions of the board become hotter than other portions, and these hot portions tend to etchback at a greater rate than the cooler portions.

SUMMARY OF THE INVENTION

It is an object of the present invention to provide a plasma desmear/etchback system having improved etchback uniformity and reduced processing times.

The present invention is for a process for etching back the exposed layers of resin in drilled multi-layered resin/copper laminates. The process is carried out in an evacuatable chamber having at least one ground electrode plate within the chamber and at least one radio frequency electrode plate within the chamber. The process comprises the steps of heating at least one of the electrode plates to a temperature of at least 200 degrees Fahrenheit, said plate being referred to as a "heated plate," and placing a drilled, multi-layered resin/copper laminate on a surface of said heated plate. The next step is the evacuating of air from the area and the introduction of gasses surrounding the laminate to be etched back and activating a radio frequency generator to create a plasma flow in the chamber. The flow of plasma is maintained for a predetermined length of time until the resin has been etched back from the surface of the exposed edges of the resin in the drilled holes through the laminate, thereby exposing the copper layers for further plating. Preferably, the electrode plates are oriented horizontally. In a preferred configuration, all of the plates in the chamber are heated by the passage of a heat transfer fluid therethrough. The apparatus which carries out the process set forth above is also a part of the present invention.

BRIEF DESCRIPTION OF THE DRAWINGS

FIG. 1 is a perspective view of the plasma desmear/etchback system of the present invention.

FIG. 2 is an enlarged perspective view of the electrode plates of the plasma desmear/etchback apparatus of FIG. 1.

FIG. 3 is an enlarged front view of two of the electrode plates of the apparatus of FIG. 1, having a multi-layered resin/copper laminate on the lower plate thereof.

DESCRIPTION OF THE PREFERRED EMBODIMENTS

The plasma desmear/etchback apparatus of the present invention is shown in perspective view in FIG. 1 and indicated generally by reference character 10. The apparatus has a chamber door 11 which, when closed, forms an airtight seal along the front edge 12 of chamber 13. A plurality of electrode plates are shown in phantom lines in FIG. 1 and identified by reference characters 14 through 17. Chamber door 11 has a handle 18 and a window 19 which permit the viewing of the plasma within the chamber. A control panel, indicated generally by reference character 20, contains the appropriate switches and gauges for controlling the processing conditions within the chamber.

The electrode plates are shown in enlarged perspective view in FIG. 2 and can be seen to be horizontally oriented, thereby permitting the drilled, multi-layered resin/copper laminates 21 through 23 to rest directly on the upper surface of plates 15 through 17, respectively. In order to create a flow of plasma, a radio frequency source is connected to plate 15 and 17, while plates 14 and 16 are grounded.

Plates 14 through 17 are drilled with a gun drill to provide a fluid passageway therethrough, and each plate has an inlet opening indicated by reference characters 24 through 27 to which inlet pipes 28 through 31 are connected. Similarly, plates 14 through 17 are provided with outlet openings 32 through 35 and are connected to outlet pipes 36 through 39. The inlet pipes 28 through 31 are connected to an inlet manifold 40 which is fed by an inlet pipe 41 affixed to heater 42. Outlet pipes 36 through 39 are connected to outlet manifold 43 which, in turn, is connected to outlet pipe 44 which is attached to the inlet of pump 45 which feeds heater 42. A temperature controller 46 provides accurate temperature control for heat transfer fluid which is passed through the plates.

In operation, the drilled multi-layer printed circuit boards are preferably preheated in an oven to improve the etchback process, and the boards 21 through 23 are then placed directly on the upper surface of each of the plates except the top plate, all plates having been preheated to a predetermined control temperature by the passage of heat transfer fluid as discussed above. Door 11 is then closed, the chamber is evacuated and a gas mixture of tetra fluoro methane and oxygen is introduced. The radio frequency generator is then activated and a flow of plasma is generated between the RF plates and the ground plates causing a flow of plasma which removes resin as indicated in FIG. 3. A hole 47 has been drilled through copper layers 48 through 51 and through resin layers 52 through 54. As depicted in FIG. 3, the resin has now been etched back from the surface of the hole which tends to expose the copper layers which may then readily be plated to electrically connect all of the copper layers at hole 47 in a manner well known to those skilled in the art.

Because the flow of plasma tends to increase the temperature of the laminate, the use of an accurately controlled flow of heat transfer fluid through the passageways of each of the plates results in the maintaining of a desired temperature in each of the laminates. In this way, the rate of etchback is constant for all parts of the board. The use of a heat transfer fluid tends to create a heat sink, and the fluid is capable of cooling a board which has a temperature above that of the heat transfer fluid. Furthermore, the horizontal configuration provides ease of loading and unloading and the suspension of boards on vertical racks is no longer necessary. Since different types of resin, such as epoxy, polyimide, kapton/acrylic and the like, have different etch rates in identical processing conditions, the use of the apparatus of the present invention permits the operator to set the desired optimum temperature for the particular resin used in the board to be etched back. Day-to-day etchback uniformity is also assured by the accurate control of board temperature, and the direct contact between the board and the electrode greatly assists in the accurate maintaining of the temperature of the printed circuit board. Furthermore, the chamber can be located as shown in FIG. 1 at a level which makes loading and unloading comfortable for the operator.

The present embodiments of this invention are thus to be considered in all respects as illustrative and not restrictive; the scope of the invention being indicated by the appended claims rather than by the foregoing description. All changes which come within the meaning and range of equivalency of the claims are intended to be embraced therein.

What is claimed is:

1. A process for etching back the exposed edges of layers of resin in drilled, multi-layered resin/copper laminates in an evacuatable chamber having at least one ground electrode plate within the chamber and at least one radio frequency electrode plate within the chamber, comprising the steps of:
   heating at least one electrode plate to a temperature of at least 200 degrees Fahrenheit, said plate being a heated plate;
   placing at least one board to be etched on a surface of said heated plate;
   evacuating the air from the area surrounding the board to be etched and introducing a gas mixture to enhance the plasma etching process;
   activating a radio frequency generator to create a plasma flow in the chamber while continuing to maintain said at least one heated electrode plate at a temperature of at least 200 degrees Fahrenheit; and
   maintaining the flow of plasma for a predetermined length of time until the resin has been etched back from the surface of said exposed edges.

2. The process of claim 1 wherein said electrode plates are oriented horizontally.

3. The process of claim 1 wherein all of the electrode plates in said chamber are heated to at least 200 degrees Fahrenheit.

4. The process of claim 3 wherein said plates have a fluid passageway therein, having a fluid inlet and a fluid outlet and are heated by passing a heat transfer fluid through said passageways.

5. The process of claim 4 wherein all the fluid inlets are connected to an inlet manifold and all the fluid outlets are connected to an outlet manifold.

6. The process of claim 3 wherein said plates are heated to about 275 degrees Fahrenheit.

7. An improved plasma desmear/etchback apparatus for etching back the exposed edges of layers of resin in drilled multi-layered resin/copper laminates of the type having a plurality of ground electrode plates and a plurality of radio frequency electrode plates in parallel orientation in an evacuatable chamber, wherein the improvement comprises:
   a fluid passageway in at least two of said plates, said plates being heated plates and at least one of said heated plates being connected to a radio frequency source and at least one of said heated plates being a ground plate, said fluid passageway being connected to a source of temperature controlled heat transfer fluid whereby a board to be etched may be placed directly on the surface of one of said heated plates and the temperature of the plates being accurately controllable;
   heating means to heat the heat transfer fluid to a controllable temperature; and
   pump means to cause said heat transfer fluid to flow through the fluid passageway in said heated plates.

8. The improved plasma desmear/etchback apparatus of claim 7 wherein said electrode plates are positioned about horizontally.

9. The improved plasma desmear/etchback apparatus of claim 8 wherein there are a plurality of heated ground electrode plates and a plurality of heated radio frequency electrode plates.

10. The improved plasma desmear/etchback apparatus of claim 9 wherein each of said ground electrode plates and each of said radio frequency electrode plates have a fluid passageway therein and are heated by the passage of a heat transfer fluid therethrough.

11. The improved plasma desmear/etchback apparatus of claim 10 wherein each of said plates has a fluid inlet and a fluid outlet, and each fluid inlet of each plate is connected to a fluid inlet manifold, and each fluid outlet of each plate is connected to a fluid outlet manifold.

* * * * *